(12) United States Patent
Ng

(10) Patent No.: US 9,117,807 B2
(45) Date of Patent: Aug. 25, 2015

(54) INTEGRATED PASSIVES PACKAGE, SEMICONDUCTOR MODULE AND METHOD OF MANUFACTURING

(71) Applicant: Infineon Technologies AG, Neubiberg (DE)

(72) Inventor: Chee Yang Ng, Johor (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 52 days.

(21) Appl. No.: 13/951,549

(22) Filed: Jul. 26, 2013

(65) Prior Publication Data

US 2015/0028463 A1 Jan. 29, 2015

(51) Int. Cl.
| | |
|---|---|
| H01L 23/50 | (2006.01) |
| H01L 21/70 | (2006.01) |
| H01L 23/495 | (2006.01) |
| H01L 21/56 | (2006.01) |
| H01L 23/28 | (2006.01) |
| H01L 23/498 | (2006.01) |
| H01L 21/48 | (2006.01) |
| H01L 23/31 | (2006.01) |

(52) U.S. Cl.
CPC ...... *H01L 23/49503* (2013.01); *H01L 21/4853* (2013.01); *H01L 21/56* (2013.01); *H01L 23/28* (2013.01); *H01L 23/3121* (2013.01); *H01L 23/49531* (2013.01); *H01L 23/49575* (2013.01); *H01L 23/49816* (2013.01); *H01L 23/49822* (2013.01); *H01L 2224/48137* (2013.01)

(58) Field of Classification Search
USPC ............... 257/723, 724, 924, 904, E25.03, 257/E25.014, E25.015, E25.016, 257/E25.023–E25.026, E25.004, 257/E23.043–E23.05; 438/107, 111, 112, 438/121, 123, 128
See application file for complete search history.

(56) References Cited

U.S. PATENT DOCUMENTS

| | | | | |
|---|---|---|---|---|
| 6,781,222 | B2* | 8/2004 | Wu et al. | 257/684 |
| 7,968,800 | B2* | 6/2011 | Sasaoka et al. | 174/258 |
| 2006/0245308 | A1* | 11/2006 | Macropoulos et al. | 369/1 |
| 2008/0296735 | A1* | 12/2008 | Takehara et al. | 257/621 |
| 2012/0049344 | A1* | 3/2012 | Pagaila et al. | 257/737 |
| 2012/0286415 | A1* | 11/2012 | Sakai et al. | 257/734 |

\* cited by examiner

*Primary Examiner* — Jasmine Clark
(74) *Attorney, Agent, or Firm* — Murphy, Bilak & Homiller, PLLC

(57) ABSTRACT

An integrated passives package includes an encapsulation compound and a plurality of electrically conductive pads embedded in the encapsulation compound. Each of the pads has opposing first and second sides. The first side of the pads is uncovered by the encapsulation compound and forms array of external electrical connections at a first side of the package. The integrated passives package further includes a plurality of passive components embedded in the encapsulation compound. Each of the passive components has a first terminal attached to one of the pads and a second terminal attached to a different one the pads at the second side of the pads. Corresponding semiconductor modules and methods of manufacturing are also provided.

19 Claims, 12 Drawing Sheets

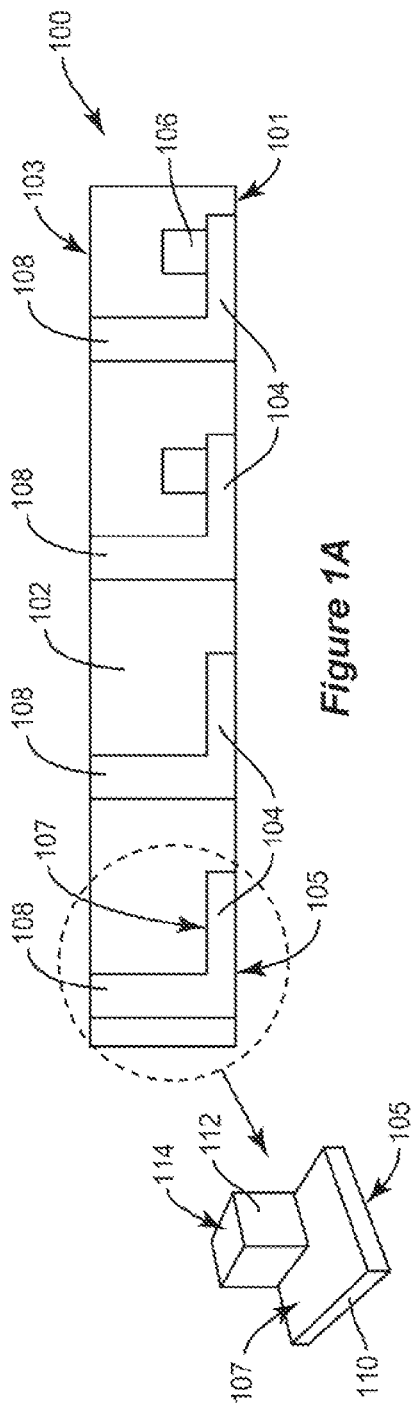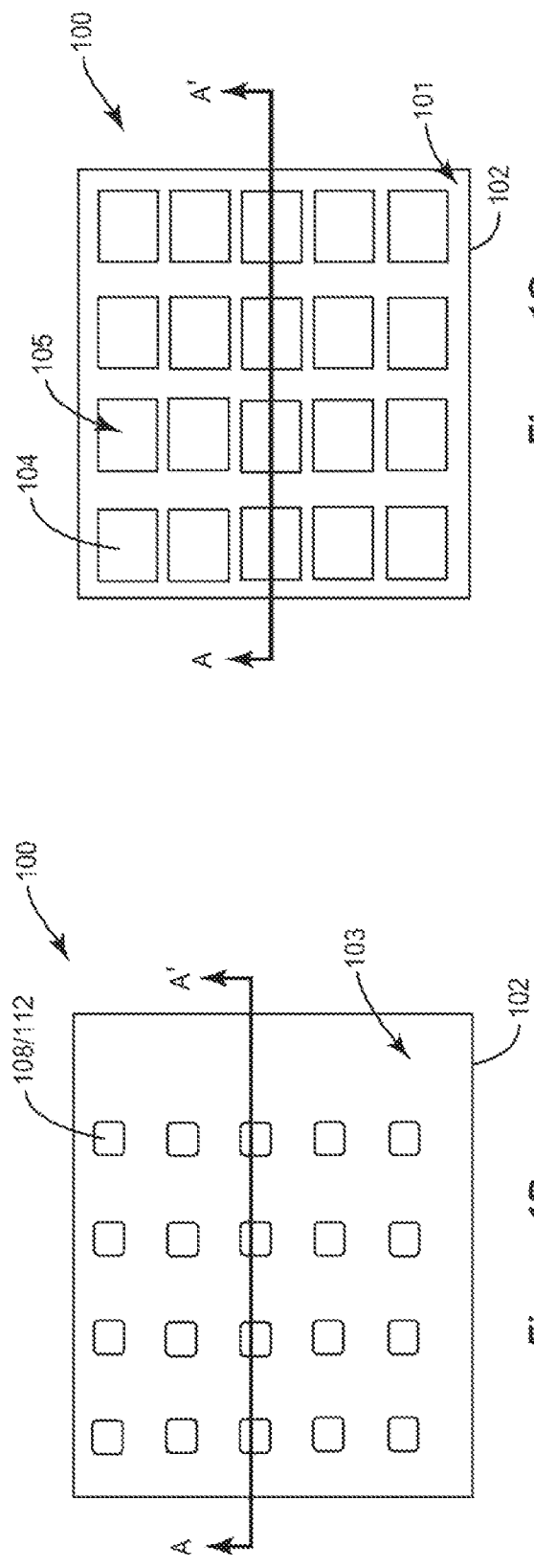

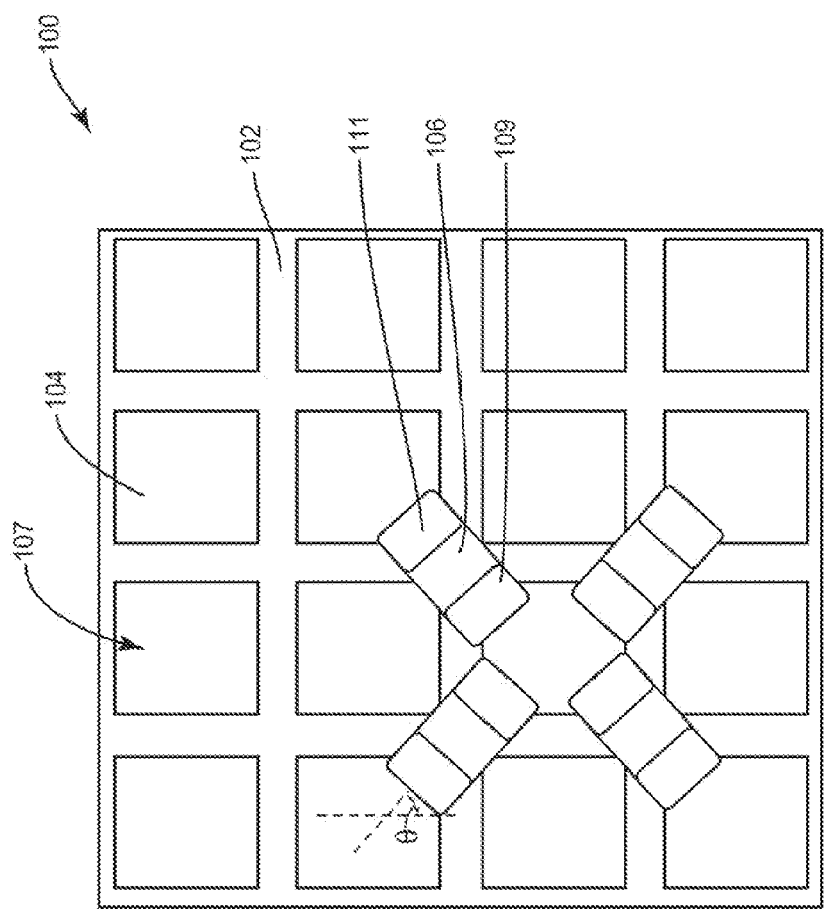

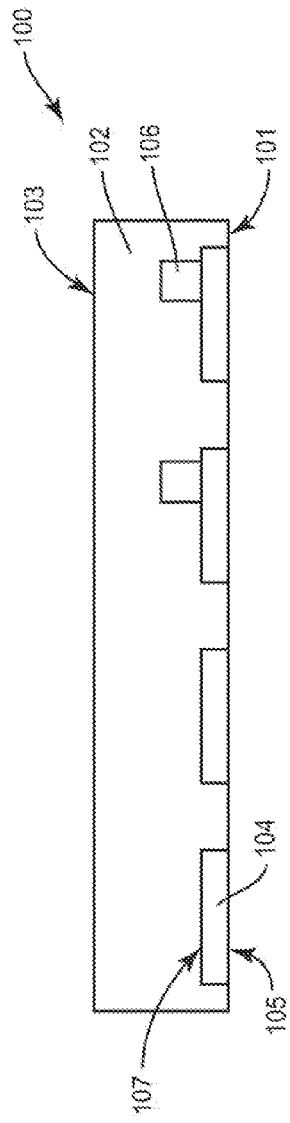
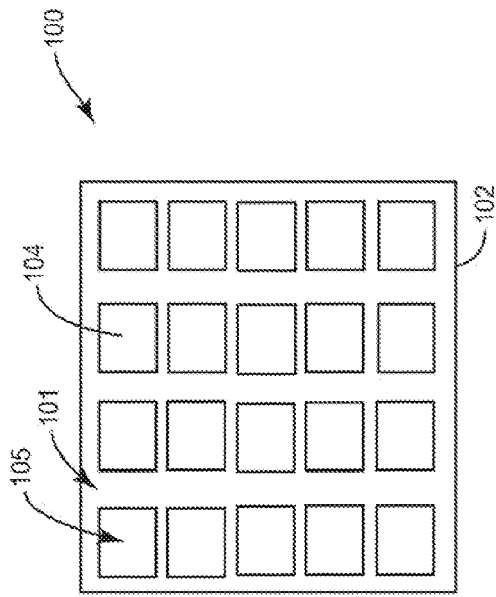
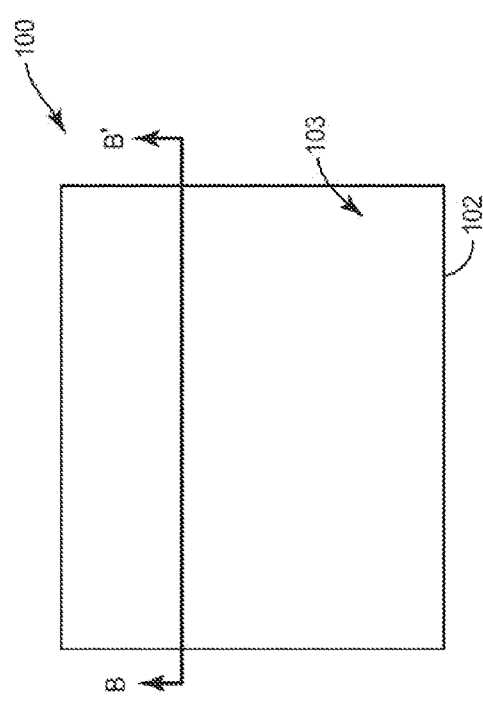

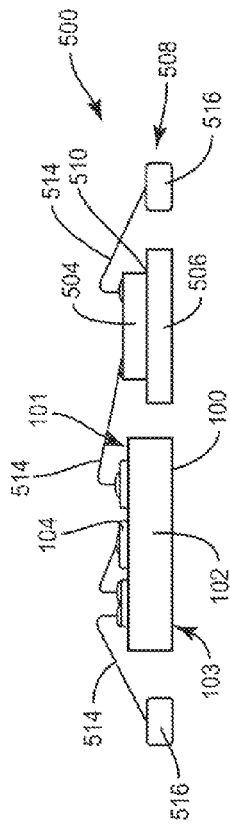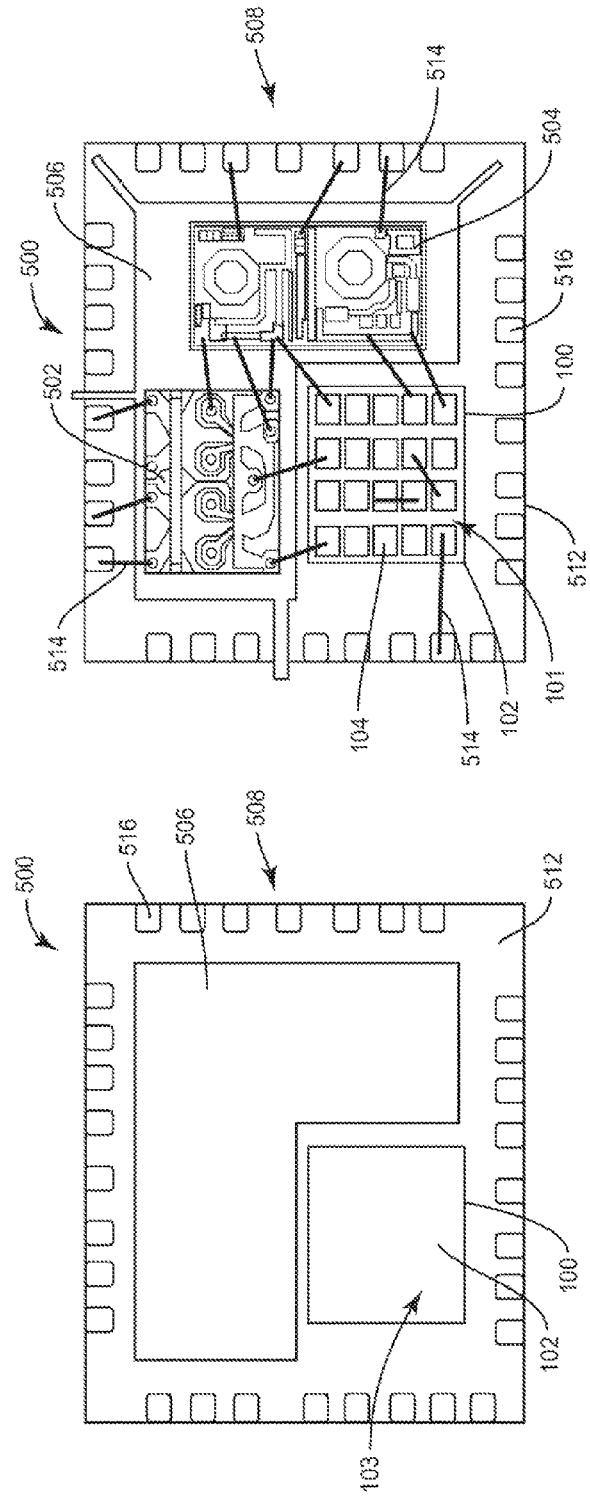

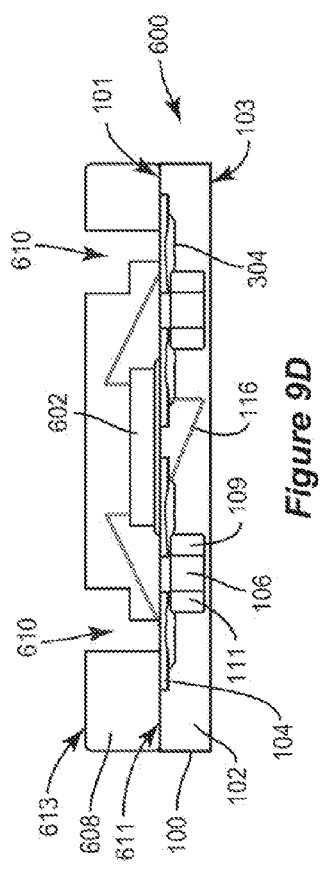
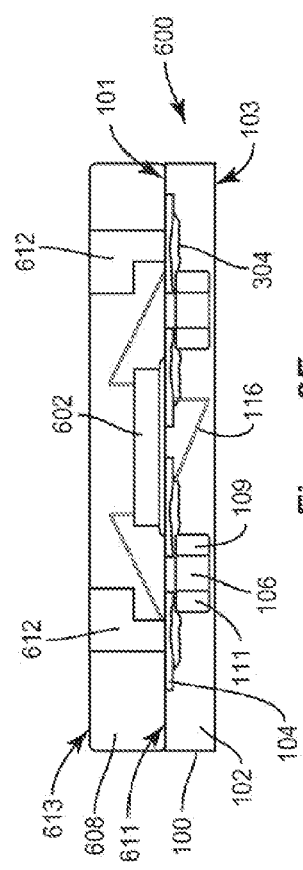
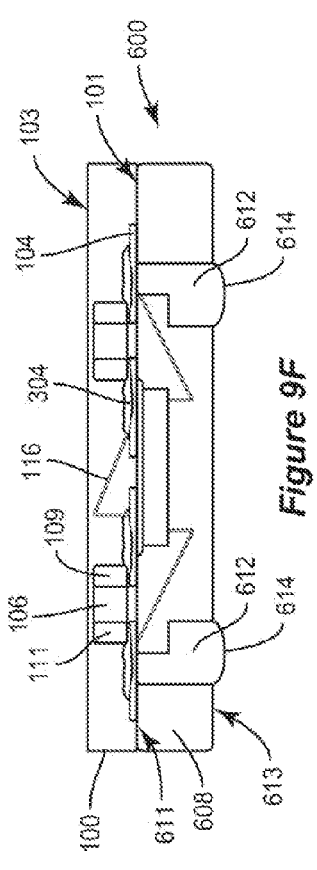
Figure 9D
Figure 9E
Figure 9F

INTEGRATED PASSIVES PACKAGE, SEMICONDUCTOR MODULE AND METHOD OF MANUFACTURING

FIELD OF TECHNOLOGY

The present application relates to semiconductor modules, in particular semiconductor modules which include passive devices.

BACKGROUND

Conventional semiconductor modules which include passive components such as inductors, capacitors, and/or resistors are typically manufactured using a laminated substrate or a lead frame that is covered with an encapsulation compound. In the case of a conventional laminated substrate, discrete passive components and active semiconductor dies (chips) are placed on the laminated substrate, interconnected via bond wires to form an integrated circuit, or a simple SMT pick-and-place process is used to place the necessary components, and then the dies are covered with an encapsulation compound. In the case of a conventional lead frame, the passive components are provided as one or more dies which are placed on the lead frame with active semiconductor dies. Each passive die includes passive components integrated into a chip, typically called an integrated passive die (IPD). The passive and active dies are interconnected via bond wires and then covered with an encapsulation compound. Laminated substrates are more expensive than lead frames, increasing the cost of semiconductor modules which use laminated substrate instead of lead frames. A semiconductor module which uses passive dies on a lead frame has less flexibility with regard to changing customer specifications than modules which use laminated substrate, especially in the development phase, resulting in long response time and higher cost. IPDs typically have higher cost and cycle time (i.e. wafer fabrication) as compared to laminated substrate solutions, and also slow response to customer design change.

SUMMARY

According to an embodiment of an integrated passives package, the integrated passives package comprises a plurality of electrically conductive pads and a plurality of passive components embedded in an encapsulation compound. Each of the pads has opposing first and second sides. The first side of the pads is uncovered by the encapsulation compound and forms an array of external electrical connections at a first side of the package. Each of the passive components has a first terminal attached to one of the pads and a second terminal attached to a different one the pads at the second side of the pads.

According to an embodiment of a method of manufacturing an integrated passives package, the method comprises: providing a plurality of electrically conductive pads and a plurality of passive components, each pad having opposing first and second sides and each passive component having first and second terminals; attaching the first terminal of each passive component to one of the pads and the second terminal to a different one the pads at the second side of the pads; embedding the pads and the passive components in an encapsulation compound so that the first side of the pads are uncovered by the encapsulation compound; and separating groups of the embedded pads and passive components into discrete integrated passives packages, each integrated passives package having an array of external electrical connections at a side of the package formed by the first side of the pads included in the package.

According to an embodiment of a semiconductor module, the semiconductor module comprises an integrated passives package and a semiconductor die. The integrated passives package comprises a plurality of electrically conductive pads and a plurality of passive components embedded in an encapsulation compound. Each of the pads has opposing first and second sides. The first side of the pads is uncovered by the encapsulation compound and forms an array of external electrical connections at a first side of the integrated passives package. Each of the passive components has a first terminal attached to one of the pads and a second terminal attached to a different one the pads at the second side of the pads. The semiconductor die is electrically connected to at least some of the external electrical connections at the first side of the integrated passives package.

According to an embodiment of a method of manufacturing a semiconductor module, the method comprises providing an integrated passives package comprising: a plurality of electrically conductive pads embedded in an encapsulation compound, each of the pads having opposing first and second sides, the first side of the pads being uncovered by the encapsulation compound and forming an array of external electrical connections at a first side of the integrated passives package; and a plurality of passive components embedded in the encapsulation compound, each of the passive components having a first terminal attached to one of the pads and a second terminal attached to a different one the pads at the second side of the pads. The method further comprises electrically connecting a semiconductor die to at least some of the external electrical connections at the first side of the integrated passives package.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1D illustrate different views of an embodiment of an integrated passives package.

FIG. 2 illustrates a top plan view of another embodiment of an integrated passives package.

FIGS. 3A through 3C illustrate different views of yet another embodiment of an integrated passives package.

FIGS. 7A through 7C illustrate different views of another embodiment of a semiconductor module including an integrated passives package.

FIGS. 9A through 9F illustrate different stages of a method of manufacturing a semiconductor package including an integrated passives package according to an embodiment.

DETAILED DESCRIPTION

The embodiments described herein provide integrated passives packages, semiconductor modules which include integrated passives packages and methods of manufacturing such integrated passives package and semiconductor modules. The integrated passives packages include only passive components, and are covered with an encapsulation compound to protect the passive components. The passive components within the package can be interconnected to each other or disconnected from each other. In either case, the integrated passives package has external electrical connections for providing points of electrical connection to the passive components within the package. Active semiconductor die(s) can be electrically connected to the integrated passives package to form an integrated circuit.

Figure 1D:
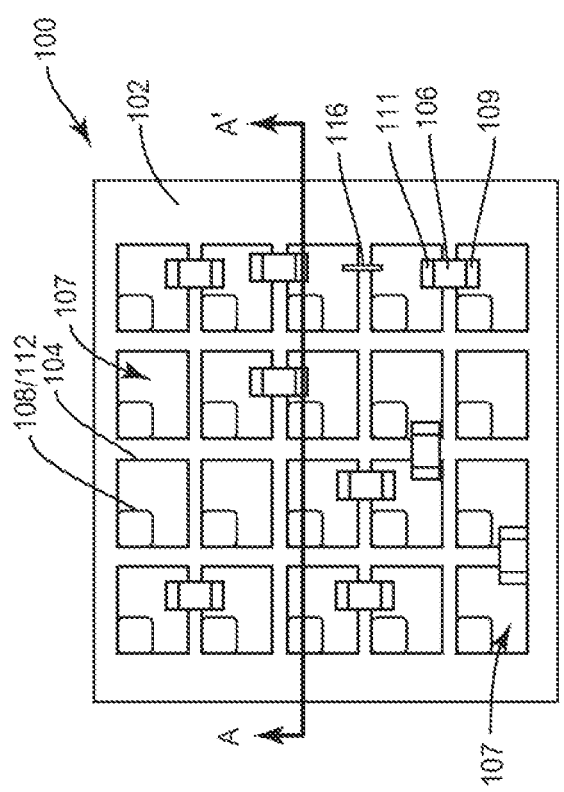

FIGS. 1A through 1D illustrate different views of an embodiment of an integrated passives package 100. FIG. 1A shows a sectional view of the integrated passives package 100 along the line labeled A-A' in FIGS. 1B, 1C and 1D. FIG. 1B shows a plan view of the top (second) side 103 of the integrated passives package 100. FIG. 1C shows a plan view of the bottom (first) side 101 of the integrated passives package 100. FIG. 1D shows the integrated passives package 100 with part of the encapsulation compound 102 removed from the second side 103 of the package 100, so that the encased inner part of the package 100 is visible.

The integrated passives package 100 includes a plurality of electrically conductive pads 104 and a plurality of passive components 106 embedded in the encapsulation compound 102. Any standard encapsulation compound can be used. Encapsulation compounds typically comprise composite materials consisting of epoxy resins, phenolic hardeners, silicas, catalysts, pigments, and mold release agents, for example. There are many types of encapsulation compounds used in the semiconductor industry. General-purpose encapsulation compounds with relatively high flexural strengths but which exert relatively larger stresses may be used for large and thick packages. Low to ultra-low stress encapsulation compounds are preferred for the encapsulation of thin packages. High-thermal conductivity encapsulation compounds are typically used to encapsulate high-power devices. Encapsulation compounds used for surface mount devices may have a low moisture absorption rate, or a high flexural strength at board-mounting temperatures, or a combination of both in order to prevent cracking.

According to the embodiment shown in FIGS. 1A through 1D, each of the pads 104 has opposing first (bottom) and second (top) sides 105, 107. The first side 105 of the pads 104 is uncovered by the encapsulation compound 102 and form an array of external electrical connections at the first side 101 of the integrated passives package 100 as shown in FIGS. 1A and 1C. Each of the passive components 106 has a first end or terminal 109 attached to one of the pads 104 and a second end or terminal 111 attached to a different one the pads 104 at the second side 107 of the pads 104 as shown in FIG. 1D. The passive components 106 are covered on all sides according to this embodiment. The passive components 106 included in the integrated passives package 100 can be inductors, capacitors, resistors, etc.

Further according to the embodiment shown in FIGS. 1A through 1D, the integrated passives package 100 further comprises an electrically conductive region 108 extending from the second side 107 of at least some of the pads 104 and away from the first side 105 of the pads 104 as shown in FIG. 1A. Each electrically conductive region 108 protrudes through the encapsulation compound 102 at the second side 103 of the integrated passives package 100 and forms part of an array of external electrical connections at the second side 103 of the package 100 as shown in FIG. 1B.

FIG. 1A shows an enlarged, three-dimensional view of one of the pads 104 with the electrically conductive extension region 108. According to this embodiment, the pad 104 comprises a base region 110 and an extension region 112. The base region 110 has a first side 105 that is uncovered by the encapsulation compound 102 and forms part of the array of external electrical connection points at the first side 101 of the integrated passives package 100. One or more passive components 106 can be attached to the opposing second side 107 of the base region 110. The extension region 112 extends from the second side 107 of the base region 110 and has a distal end 114 that protrudes through the encapsulation compound 102 at the second side 103 of the integrated passives package 100 and forms part of the array of external electrical connections at the second side 103 of the package 100.

With regard to the embodiment shown in FIGS. 1A through 1D, at least some of the passive components 106 can be electrically connected together inside the integrated passives package 100 e.g. via bonding wires, ribbons, metal clips, or other electrical conductors 116 as shown in FIG. 1D. Alternatively or in addition, at least some of the passive components 106 can be electrically connected together inside the package 100 by being attached to the same pad 104 also as shown in FIG. 1D.

FIG. 2 illustrates the same view as in FIG. 1D, but of a different embodiment of the integrated passives package 100. According to the embodiment shown in FIG. 2, at least some of the passive components 106 are connected to the pads 104 of the package 100 at an angle θ with respect to the pads 104 other than 90 or 180 degrees.

FIGS. 3A through 3C illustrate different views of yet another embodiment of the integrated passives package 100. FIG. 3A shows a sectional view of the integrated passives package 100 along the line labeled B-B' in FIGS. 3B and 3C. FIG. 3B shows a plan view of the second (top) side 103 of the integrated passives package 100, and FIG. 3C shows a plan view of the first (bottom) side 101 of the package 100. The embodiment shown in FIGS. 3A through 3C is similar to the embodiment shown in FIGS. 1A through 1D, however, the pads 104 do not have an extension region 108/112. As such, the integrated passives package 100 has an array of external electrical connections at the first side 101 of the package 100 formed by the uncovered side 105 of the pads 104 and no array of external electrical connections at the second side 103 of the package 100. That is, the second side 103 of the package 100 remains completely covered by the encapsulation compound 102.

Described next are embodiments of manufacturing the integrated passives package 100.

Figure 4B:
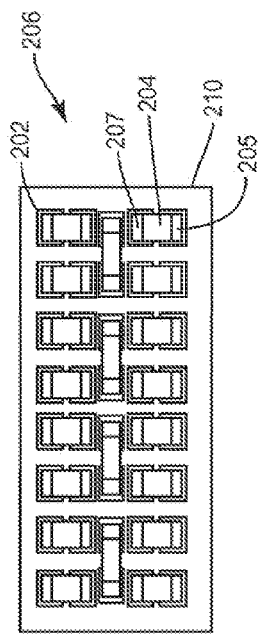
FIGS. 4A through 4C illustrate different stages of a method of manufacturing integrated passives packages according to an embodiment.
Figure 4C:
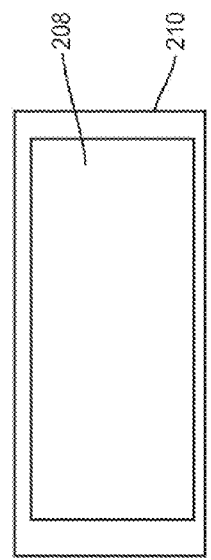
Figure 4A:
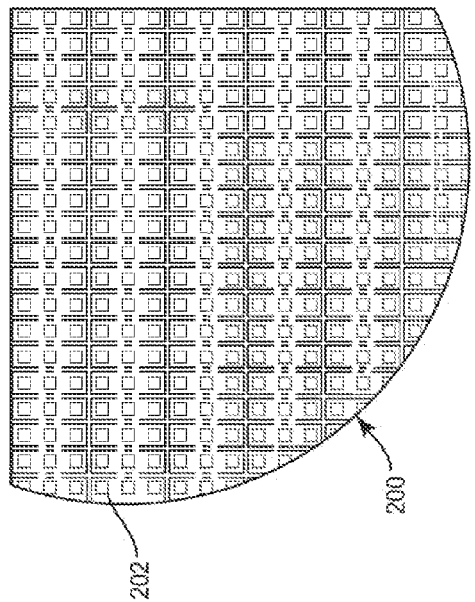

FIGS. 4A through 4C illustrate different stages of a method of manufacturing the integrated passives package 100, according to an embodiment. The method comprises providing a support substrate 200 and placing a plurality of pads 202 on the support substrate with a first side (out of view) of the pads 202 facing the support substrate 200 and the opposing (second) side 203 of the pads 202 facing away from the support substrate 200 as shown in FIG. 4A, which is a partial top plan view of the support substrate 200. Any standard support substrate can be used such as a copper plate, TSLP (thin small leadless package) frame, adhesive tape, a pre-molded frame, etc. The pads 202 can be uniformly or non-uniformly spaced. The pads 202 can be uniformly or non-uniformly sized. In the case of a pre-molded frame as the support substrate 200, the pads 2 can be embedded in the pre-molded frame so that both sides of the pads 202 are exposed.

Solder is then applied to the second side 203 of the pads 202 e.g. by printing solder paste or any other suitable conductive paste after the pads 202 are placed on the support substrate 200. A plurality of passive components 204 are provided for attachment to the pads 202. The first terminal 205 of each passive component 204 is placed on the paste applied to one of the pads 202 and the second terminal 207 on the paste applied to a different one the pads 202. The paste is then solidified to attach the terminals 205, 207 of the passive components 204 to the corresponding die pads 202. Groups of the pads 202 and passive components 204 are then separated into discrete segments 206 as shown in FIG. 4B. Each segment 206 is then molded so that the pads 202 and passive components 204 of the segment 206 are embedded in an encapsulation compound 208 as shown in FIG. 4C. The molding process can be performed before or after separation of the segments 206. At least some of the passive components 204 can be electrically connected to each other before the pads 202 and passive components 204 are embedded in the encapsulation compound 208.

In each case, the support substrate 200 covers the first side (out of view) of the pads 202 during the molding process so that the first side of the pads 202 is uncovered by the encapsulation compound 208. The remaining part 210 of the support substrate 200 attached to the encapsulation compound 208 of each segment 206 can be removed after separation of the segments 206. The segments 306 can be molded before or after separation to form individual integrated passives packages. Each integrated passives package has an array of external electrical connections at the first side of the package, the array of external electrical connections formed by the first side of the pads 202 included in the package e.g. as shown in FIG. 1C and FIG. 3C. In the case at least some of the pads 202 have an electrically conductive extension region as previously described herein with regard to FIGS. 1A through 1D, part of the encapsulation compound 208 can be removed at the second side of the package without exposing the passive components 204. After removal, the extension regions protrude through the encapsulation compound 208 at the second side of the package and form an array of external electrical connections at the second side of the package e.g. as shown in FIG. 1B. In the case none of the pads 202 have an electrically conductive extension region, the second side of the package remains completely covered by the encapsulation compound 208.

Figure 5A:
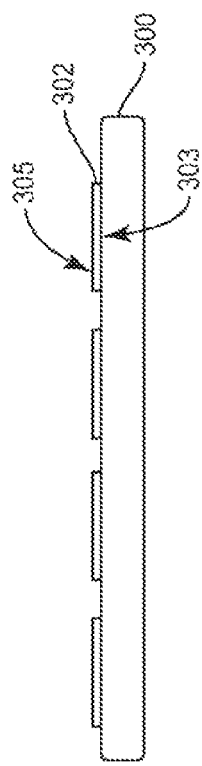
FIGS. 5A through 5F illustrate different stages of a method of manufacturing integrated passives packages according to another embodiment.

FIGS. 5A through 5F illustrate different stages of a method of manufacturing the integrated passives package 100, according to another embodiment. The method comprises providing a support substrate 300 and placing a plurality of pads 302 on the support substrate 300 with a first side 303 of the pads 302 facing the support substrate 300 and the opposing (second) side 305 of the pads 302 facing away from the support substrate 300 as shown in FIG. 5A. Any standard support substrate can be used such as a copper plate, TSLP frame, adhesive tape, etc. The pads 302 can be uniformly or non-uniformly spaced. The pads 302 can be uniformly or non-uniformly sized.

Figure 5B:
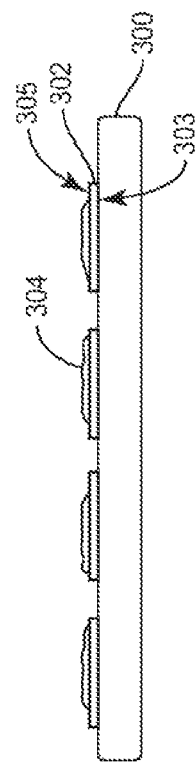
Figure 5C:
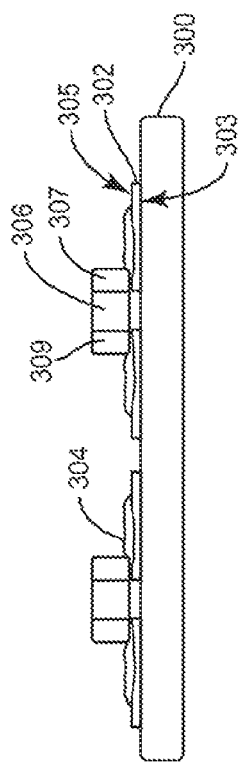
Figure 5D:
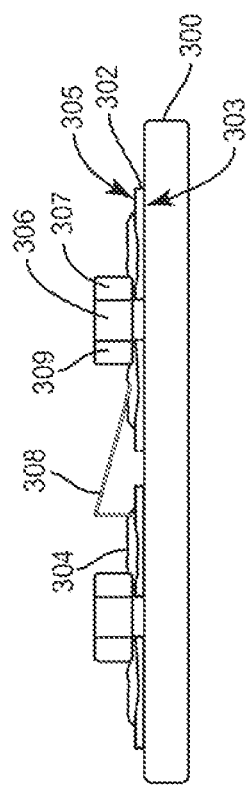
Figure 5E:
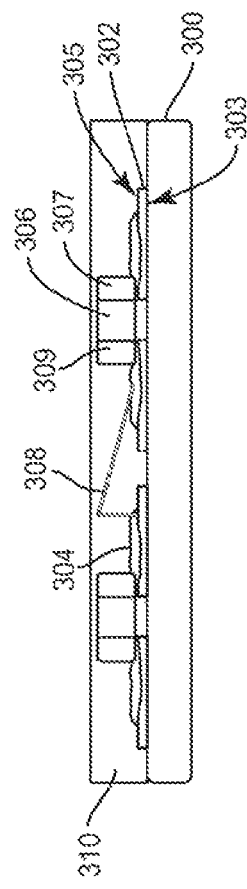
Figure 5F:
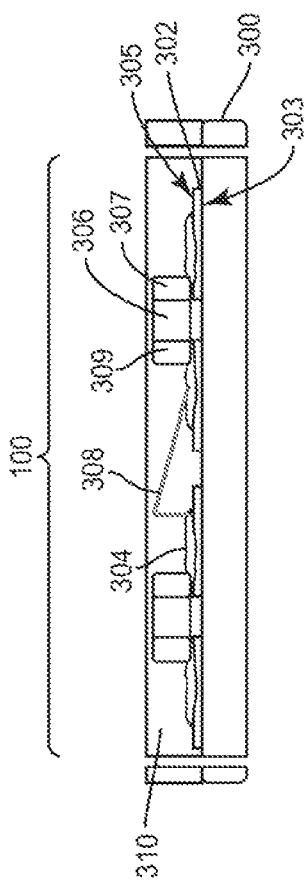

Conductive paste 304 is then applied to the second side 305 of the pads 302 e.g. by printing after the pads 302 are placed on the support substrate 300 as shown in FIG. 5B. A plurality of passive components 306 are provided for attachment to the pads 302. The first terminal 307 of each passive component 306 is placed on the conductive paste 304 applied to one of the pads 302 and the second terminal 309 on the conductive paste 304 applied to a different one the pads 302. The conductive paste 304 is then solidified to attach the terminals 307, 309 of the passive components 306 to the corresponding pads 302 as shown in FIG. 5C. Electrical connections are formed between the passive components 306 e.g. by wire bonds, ribbons or other electrical conductors 308 as shown in FIG. 5D. The pads 302, passive components 306 and interconnects 308 are then embedded in an encapsulation compound 310 as shown in FIG. 5E. The support substrate 300 covers the first side 303 of the pads 302 during the molding process so that the first side 303 of the pads 302 is uncovered by the encapsulation compound 310. Groups of the pads 302 and passive components 306 are then separated into discrete integrated passives packages 100 as shown in FIG. 5F.

Each integrated passives package 100 has an array of external electrical connections at the first side 101 of the package 100, the array of external electrical connections formed by the first side 303 of the pads 302 included in the package 100 e.g. as shown in FIG. 1C and FIG. 3C. In the case at least some of the pads 302 have an electrically conductive extension region as previously described herein with regard to FIGS. 1A through 1D, part of the encapsulation compound 310 can be removed at the second side 103 of the package 100 without exposing the passive components 306 contained within the package 100. After removal, the extension regions protrude through the encapsulation compound 310 at the second side 103 of the package 100 and form an array of external electrical connections at the second side 103 of the package 100 e.g. as shown in FIG. 1B. In the case none of the pads 302 have an electrically conductive extension region, the second side 103 of the package 100 remains completely covered by the encapsulation compound 310.

Described next are embodiments of a semiconductor module that includes an integrated passives package 100 as previously described herein. A semiconductor die is electrically connected to at least some of the external electrical connections at the first side 101 of the integrated passives package 100.

Figure 6A:
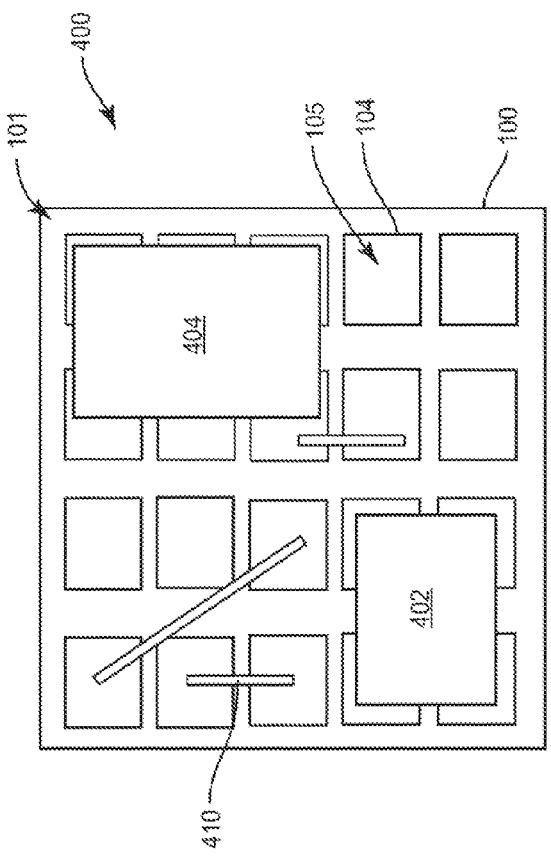
FIGS. 6A and 6B illustrate different views of an embodiment of a semiconductor module including an integrated passives package.
Figure 6B:
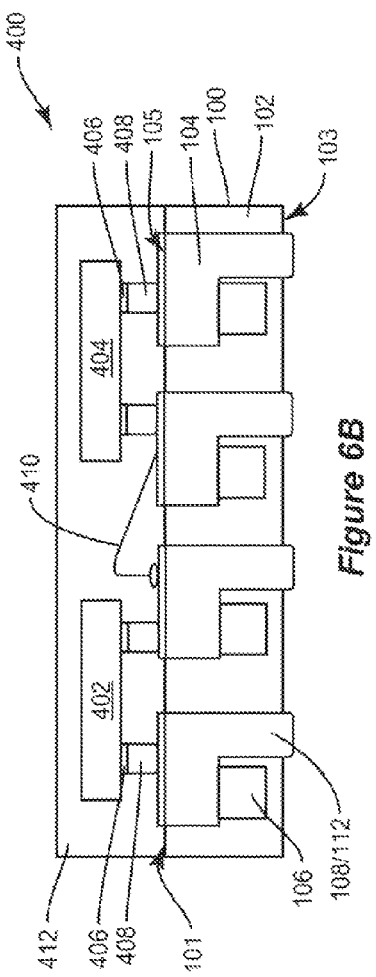

FIG. 6A shows a plan view of a semiconductor module 400 prior to molding and FIG. 6B shows a sectional view of the module 400 after molding. According to this embodiment, first and second semiconductor dies 402, 404 are disposed on the first side 101 of the integrated passives package 100. An array of external electrical connections is provided at the first side 101 of the package 100 which is formed by the uncovered side 105 of the pads 104 included in the integrated passives package 100. Each semiconductor die 402, 404 has a plurality of die pads 406 attached to at least some of the external electrical connections at the first side 101 of the integrated passives package 100 e.g. via solder bumps 408 in a flip-chip configuration as shown in FIG. 6A. Additional electrical connections can be made between different ones of the external electrical connections at the first side 101 of the integrated passive package 100 via bond wires, ribbons, clips, or other type of electrical conductors 410.

The semiconductor dies 402, 404 and electrical conductors 410 are embedded in an additional encapsulation compound 412 disposed on the first side 101 of the integrated passives package 100 as shown in FIG. 6B. In some embodiments, at least some of the pads 104 of the integrated passives package 100 comprise an electrically conductive region 108/112 extending from the second side 107 of the pads 104 and away from the first side 105 of the pads 104. Each electrically conductive region 108/112 protrudes through the encapsulation compound 102 at the second side 103 of the integrated passives package 100, and forms part of an array of external electrical connections at the second side 103 of the package 100 as shown in FIG. 6B. In the extension regions 108/112 are omitted, the encapsulation compound 102 of the integrated passives package completely covers the second side 103 of the package 100 e.g. as shown in FIGS. 3A and 3B.

FIGS. 7A through 7C illustrate different views of a semiconductor module 500 including the integrated passives package 100 as previously described herein, according to another embodiment. FIG. 7A shows a sectional view of the semiconductor module 500, FIG. 7B shows a plan view of the bottom side of the module 500 and FIG. 7C shows a plan view of the top side of the module 500. According to this embodiment, first and second semiconductor dies 502, 504 are attached to a die paddle 506 of a lead frame 508 e.g. by soldering a die pad 510 at the bottom side of the dies 502, 504 to the die paddle 506. Each semiconductor die 502, 504 is laterally spaced apart from the integrated passives package 100 so that the integrated passives package 100 is uncovered by the semiconductor dies 502, 504. The lead frame 508 can be supported by an adhesive tape 512 during manufacturing of the semiconductor module 500. The integrated passives package 100 can be disposed on the adhesive tape 512 e.g. in a cavity in the tape 512 or on another die paddle (not shown). In each case, bond wires, ribbons, clips or other electrical conductors 514 provide electrical connections between the dies 502, 504, the integrated passives package 100 and leads 516 of the lead frame 508 as shown in FIGS. 7A and 7C. The second side 103 of the integrated passives package 100 can be completely covered by an encapsulation compound 102 as shown in FIG. 7B. Alternatively, electrically conductive regions 108/112 extend from at least some of the pads 102 and through the encapsulation compound 102 at the second side 103 of the integrated passives package 100 to form an array of external electrical connections at the second side 103 of the integrated passives package 100 e.g. as shown in FIGS. 1A and 1B.

Figures 8A, 8B:
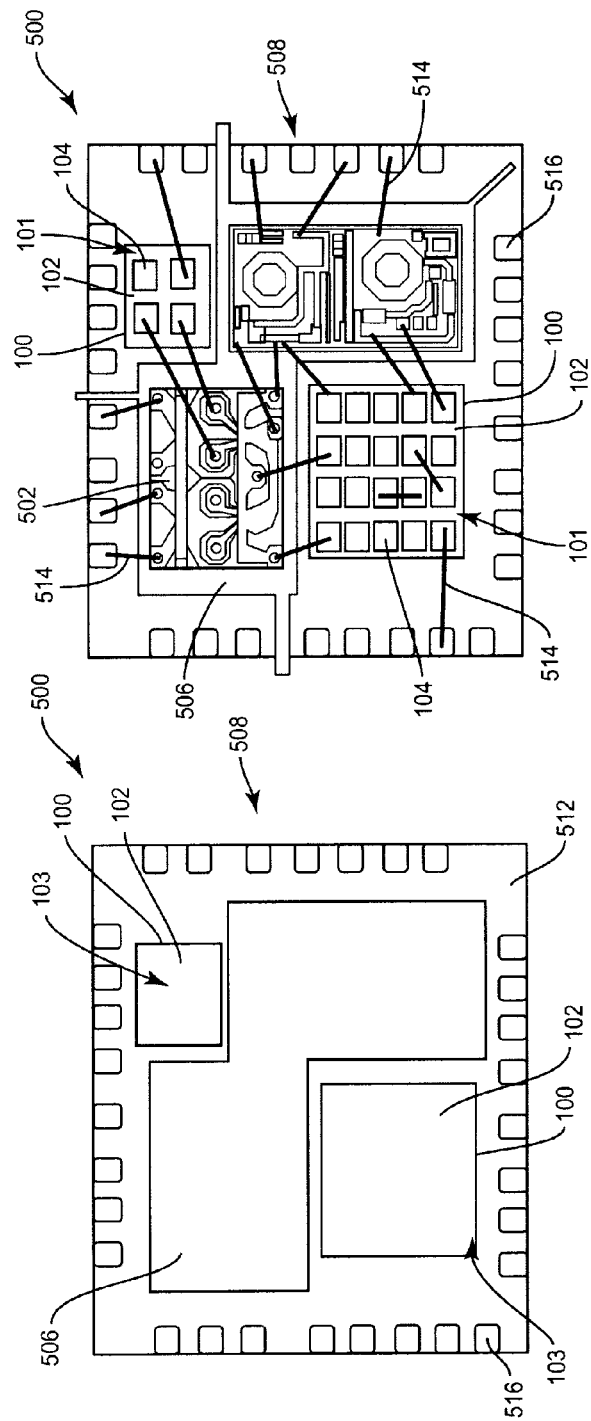
FIGS. 8A and 8B illustrate different views of yet another embodiment of a semiconductor module including an integrated passives package.

FIGS. 8A and 8B illustrate different views of the semiconductor module 500, according to another embodiment. FIG. 8A shows a plan view of the bottom side of the module 500 and FIG. 8B shows a plan view of the top side of the module 500. The embodiment shown in FIGS. 8A and 8B is similar to the embodiment shown in FIGS. 7A through 7C, however, two integrated passives packages 100 are included in the module 500. In general, the semiconductor module 500 may include any practical number of semiconductor dies and integrated passives packages. The semiconductor dies referred to herein include at least active semiconductor devices such as transistors, diodes, etc. and form an integrated circuit when connected to one or more integrated passives packages and optionally other semiconductor dies.

Figure 9A:
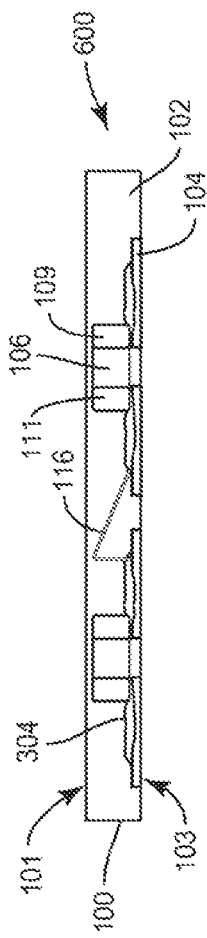
Figure 9B:
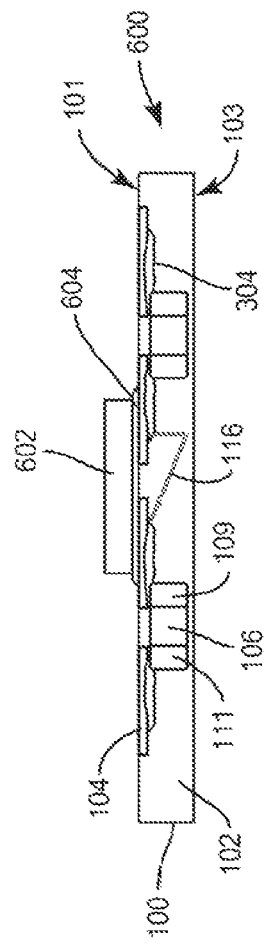
Figure 9C:
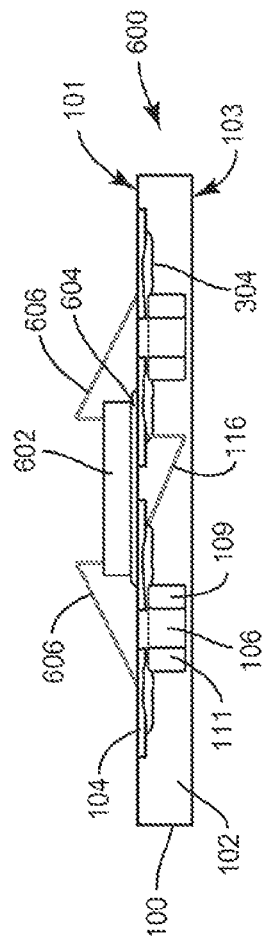

FIGS. 9A through 9H illustrate sectional views of a semiconductor module 600 during different stages of manufacturing. FIG. 9A shows the integrated passives package 100 of FIG. 5F after removal of the support substrate 300. FIG. 9B shows the integrated passives package 100 with a semiconductor die 602 attached to at least one of the external electrical connections at the first side 101 of the package 100 e.g. via conductive paste 604. FIG. 9C shows the module 600 after wire bonds or other electrical conductors 606 are connected from the free side of the semiconductor die 602 to one or more different ones of the external electrical connections at the first side 101 of the integrated passives package 100. FIG. 9D shows the module 600 after the semiconductor die 602 is embedded in an additional encapsulation compound 608 formed on the first side 101 of the integrated passives package 100 and openings 610 are formed in the additional encapsulation compound 608. The openings 610 extend from a first side 611 of the additional encapsulation compound 608 facing the integrated passives package 100 to a second side 613 of the additional encapsulation compound 608 facing away from the integrated passives package 100. FIG. 9E shows the module 600 after a plurality of electrically conductive regions 612 are formed in the openings 610 e.g. by conductive paste printing. The electrically conductive regions 612 contact (e.g. after solidification) at least some of the pads 102 of the integrated passives package 100 uncovered by the semiconductor die 602, and form an array of external electrical connections at the second side 613 of the additional encapsulation compound 608. FIG. 9F shows the module 600 after solder bumps 614 are formed on the array of external electrical connections at the second side 613 of the additional encapsulation compound 608. The module 600 can then be marked e.g. at the second side 103 of the integrated passives package 100. In the case of multiple modules and integrated passives packages formed on a common support substrate, the modules can be separated into individual modules.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated passives package, comprising:
   an encapsulation compound;
   a plurality of electrically conductive pads embedded in the encapsulation compound, each of the pads having opposing first and second sides, the first side of the pads being uncovered by the encapsulation compound and forming an array of external electrical connections at a first side of the package;
   a plurality of passive components embedded in the encapsulation compound, each of the passive components having a first terminal attached to one of the pads and a second terminal attached to a different one of the pads at the second side of the pads; and
   an electrically conductive region extending from the second side of at least some of the pads and away from the first side of the pads, each electrically conductive region protruding through the encapsulation compound at a second side of the package opposing the first side of the package and forming part of an array of external electrical connections at the second side of the package.

2. The integrated passives package of claim 1, wherein at least some of the passive components are electrically connected together inside the encapsulation compound.

3. A method of manufacturing an integrated passives package, the method comprising:
- providing a plurality of electrically conductive pads and a plurality of passive components, each pad having opposing first and second sides and each passive component having first and second terminals, at least some of the pads comprising an electrically conductive region extending from the second side of the pads and away from the first side of the pads;
- attaching the first terminal of each passive component to one of the pads and the second terminal to a different one of the pads at the second side of the pads;
- embedding the pads and the passive components in an encapsulation compound so that the first side of the pads are uncovered by the encapsulation compound;
- separating groups of the pads and passive components into discrete integrated passives packages, each integrated passives package having an array of external electrical connections at a side of the package formed by the first side of the pads included in the package; and
- removing part of the encapsulation compound to expose the electrically conductive regions without exposing the passive components, so that the electrically conductive regions protrude through the encapsulation compound and form an array of external electrical connections at a side of the encapsulation compound opposite the first side of the pads.

4. The method of claim 3, wherein providing the pads comprises placing the pads on a support substrate with the first side of the pads facing the support substrate and the second side of the pads facing away from the support substrate.

5. The method of claim 4, wherein attaching the first terminal of each passive component to one of the pads and the second terminal to a different one of the pads at the second side of the pads comprises:
- applying conductive paste to the second side of the pads after the pads are placed on the support substrate;
- placing the first terminal of each passive component on the conductive paste applied to one of the pads and the second terminal on the conductive paste applied to a different one of the pads; and
- solidifying the conductive paste.

6. The method of claim 4, further comprising removing a remaining part of the support substrate attached to the encapsulation compound of each discrete integrated passives package after separation.

7. The method of claim 3, further comprising electrically connecting at least some of the passive components before the pads and the passive components are embedded in the encapsulation compound.

8. The method of claim 3, wherein providing the pads comprises embedding the pads in a pre-molded frame so that both sides of the pads are exposed.

9. A semiconductor module, comprising:
an integrated passives package comprising:
- a plurality of electrically conductive pads embedded in an encapsulation compound, each of the pads having opposing first and second sides, the first side of the pads being uncovered by the encapsulation compound and forming an array of external electrical connections at a first side of the integrated passives package; and
- a plurality of passive components embedded in the encapsulation compound, each of the passive components having a first terminal attached to one of the pads and a second terminal attached to a different one of the pads at the second side of the pads; and
- a semiconductor die electrically connected to at least some of the external electrical connections at the first side of the integrated passives package.

10. The semiconductor module of claim 9, wherein the semiconductor die is disposed on the first side of the integrated passives package and attached to at least one of the external electrical connections at the first side of the integrated passives package.

11. The semiconductor module of claim 10, wherein the semiconductor die is embedded in an additional encapsulation compound disposed on the first side of the integrated passives package, the semiconductor module further comprising:
a plurality of electrically conductive regions attached to at least some of the pads of the integrated passives package uncovered by the semiconductor die and extending from a first side of the additional encapsulation compound facing the integrated passives package to a second side of the additional encapsulation compound facing away from the integrated passives package, the electrically conductive regions forming an array of external electrical connections at the second side of the additional encapsulation compound.

12. The semiconductor module of claim 9, wherein at least some of the pads comprise an electrically conductive region extending from the second side of the pads and away from the first side of the pads, each electrically conductive region protruding through the encapsulation compound at a second side of the integrated passives package opposing the first side of the integrated passives package and forming part of an array of external electrical connections at the second side of the integrated passives package.

13. The semiconductor module of claim 9, further comprising one or more electrical conductors connecting different ones of the external electrical connections at the first side of the integrated passives package.

14. The semiconductor module of claim 9, wherein the semiconductor die is attached to a die paddle of a lead frame and laterally spaced apart from the integrated passives package so that the integrated passives package is uncovered by the semiconductor die.

15. A method of manufacturing a semiconductor module, the method comprising:
providing an integrated passives package comprising:
- a plurality of electrically conductive pads embedded in an encapsulation compound, each of the pads having opposing first and second sides, the first side of the pads being uncovered by the encapsulation compound and forming an array of external electrical connections at a first side of the integrated passives package; and
- a plurality of passive components embedded in the encapsulation compound, each of the passive components having a first terminal attached to one of the pads and a second terminal attached to a different one of the pads at the second side of the pads; and
electrically connecting a semiconductor die to at least some of the external electrical connections at the first side of the integrated passives package.

16. The method of claim 15, wherein electrically connecting the semiconductor die to at least some of the external electrical connections at the first side of the integrated passives package comprises:
- placing the semiconductor die on the first side of the integrated passives package; and attaching the semiconductor die to at least one of the external electrical connections at the first side of the integrated passives package.

17. The method of claim 16, further comprising:

embedding the semiconductor die in an additional encapsulation compound formed on the first side of the integrated passives package;

forming openings in the additional encapsulation compound that extend from a first side of the additional encapsulation compound facing the integrated passives package to a second side of the additional encapsulation compound facing away from the integrated passives package; and forming a plurality of electrically conductive regions in the openings, the electrically conductive regions contacting at least some of the pads of the integrated passives package uncovered by the semiconductor die and forming an array of external electrical connections at the second side of the additional encapsulation compound.

18. The method of claim 15, further comprising connecting one or more electrical conductors to different ones of the external electrical connections at the first side of the integrated passives package.

19. The method of claim 15, further comprising attaching the semiconductor die to a die paddle of a lead frame so that the semiconductor die is laterally spaced apart from the integrated passives package and the integrated passives package is uncovered by the semiconductor die.

* * * * *